(12) United States Patent
Resch et al.

(10) Patent No.: US 9,163,545 B2
(45) Date of Patent: Oct. 20, 2015

(54) THERMOELECTRIC GENERATOR WITH HEAT EXCHANGER

(71) Applicant: Eberspächer Exhaust Technology GmbH & Co. KG, Neunkirchen (DE)

(72) Inventors: Andreas Resch, Esslingen a.N. (DE); Sebastian Leicht, Bisingen (DE); Jörg Oesterle, Laichingen (DE)

(73) Assignee: Eberspächer Exhaust Technology GmbH & Co. KG, Neunkirchen (DE)

( * ) Notice: Subject to any disclaimer, the term of this patent is extended or adjusted under 35 U.S.C. 154(b) by 0 days.

(21) Appl. No.: 14/391,905

(22) PCT Filed: Apr. 10, 2013

(86) PCT No.: PCT/EP2013/057458
§ 371 (c)(1),
(2) Date: Oct. 10, 2014

(87) PCT Pub. No.: WO2013/153095
PCT Pub. Date: Oct. 17, 2013

(65) Prior Publication Data
US 2015/0075144 A1    Mar. 19, 2015

(30) Foreign Application Priority Data

Apr. 13, 2012 (DE) .................. 10 2012 206 085

(51) Int. Cl.
*F01N 3/02* (2006.01)
*F01N 5/02* (2006.01)
(Continued)

(52) U.S. Cl.
CPC .............. *F01N 5/025* (2013.01); *F01N 13/18* (2013.01); *H01L 35/30* (2013.01); *H01L 35/32* (2013.01); *F01N 2240/02* (2013.01); *F28F 9/001* (2013.01); *F28F 2275/08* (2013.01); *Y02T 10/16* (2013.01)

(58) Field of Classification Search
USPC ............ 60/274, 275, 284, 298, 299, 300, 320
See application file for complete search history.

(56) References Cited

U.S. PATENT DOCUMENTS 3,197,342 A    7/1965  Neild
3,266,944 A    8/1966  Spira et al.
(Continued)

FOREIGN PATENT DOCUMENTS

AT           508 401 A1      1/2011
DE   10 2006 019 282 A1     10/2007
(Continued)

*Primary Examiner* — Binh Q Tran
(74) *Attorney, Agent, or Firm* — McGlew and Tuttle, P.C.

(57) ABSTRACT

A heat exchanger (9), of e.g. an exhaust gas system (5) for an internal combustion engine (1), includes a thermoelectric generator (12) having a hot side (13) and a cold side (14) and including a heating tube (15) on a hot side of a heating device (10), and a cooling tube (16) on a cold side of a cooling device (11). The heating tube and the cooling tube are stacked on one another and form a tube stack (18), with the heating tube and the cooling tube extending parallel to one another in a longitudinal direction (19) of the tube stack. For energy efficiency, a housing (21) of the heat exchanger has a jacket (23) with an integral re-tensioning section (25) that is resiliently adjustable between a relaxed state and a tensioned state. The pre-tensioning section generates a pre-tensioning force (26) pressing the tube stack in a stacking direction (17).

20 Claims, 3 Drawing Sheets

(51) Int. Cl.
*H01L 35/30* (2006.01)
*H01L 35/32* (2006.01)
*F01N 13/18* (2010.01)
*F28F 9/00* (2006.01)

(56) References Cited

U.S. PATENT DOCUMENTS

| | | | |
|---|---|---|---|
| 6,986,247 B1 * | 1/2006 | Parise | 60/284 |
| 7,418,957 B2 * | 9/2008 | Abe | 123/697 |
| 8,881,513 B2 * | 11/2014 | Bruck et al. | 60/320 |
| 8,881,522 B2 * | 11/2014 | Jebasinski et al. | 60/605.1 |
| 9,003,784 B2 * | 4/2015 | Limbeck et al. | 60/320 |
| 9,021,795 B2 * | 5/2015 | Spieth et al. | 60/320 |
| 2011/0000516 A1 | 1/2011 | Hershberger et al. | |

FOREIGN PATENT DOCUMENTS

| | | |
|---|---|---|
| DE | 10 2007 063 173 A1 | 6/2009 |
| DE | 10 2008 055 946 A1 | 5/2010 |
| DE | 10 2009 013 535 A1 | 9/2010 |
| DE | 10 2010 063 460 B3 | 4/2012 |
| DE | 10 2011 076 641 A1 | 11/2012 |
| EP | 1 580 819 A2 | 9/2005 |
| JP | 2007236122 A | 9/2007 |
| WO | 2011/082803 A2 | 7/2011 |

* cited by examiner

THERMOELECTRIC GENERATOR WITH HEAT EXCHANGER

CROSS REFERENCE TO RELATED APPLICATIONS

This application is a United States National Phase Application of International Application PCT/EP2013/057458 filed Apr. 10, 2013 and claims the benefit of priority under 35 U.S.C. §119 of German Patent Application DE 10 2012 206 085.5 filed Apr. 13, 2012, the entire contents of which are incorporated herein by reference.

FIELD OF THE INVENTION

The present invention relates to a heat exchanger, in particular for an exhaust system of an internal combustion engine, preferentially in a motor vehicle. The present invention additionally relates to an internal combustion engine, in particular in a motor vehicle, which is equipped with at least one such heat exchanger.

BACKGROUND OF THE INVENTION

In order to improve the energetic efficiency of internal combustion engines, in particular in vehicle applications, it is possible to utilize heat energy, which is contained in the exhaust system of the internal combustion engine. The heat contained in the exhaust system can be converted into electric energy for example with the help of thermoelectric generators. To this end, heat exchangers of the type mentioned at the outset are employed, which comprise at least one thermoelectric generator having a hot side and a cold side. In addition or alternatively, heat exchangers can be employed for utilizing the heat energy contained in the exhaust system in order to transfer the heat from the exhaust system, which then serves as heating medium, in order to thereby heat a passenger interior or in order to evaporate the cooling medium, which then serves as operating medium within a Rankine cycle process. A heat exchanger, which comprises at least one thermoelectric generator, furthermore comprises at least one heating tube for conducting a heating medium, which is arranged on at least one hot side of such a thermoelectric generator, and at least one cooling tube for conducting a cooling medium, which is arranged on at least one cold side of such a thermoelectric generator. Practically, it can be provided here that within the heat exchanger of the at least one thermoelectric generator the at least one heating tube and the at least one cooling tube are stacked on top of one another in a stacking direction, thus forming a tube stack, in which the respective thermoelectric generator, the respective heating tube and the respective cooling tube extend parallel to one another in a longitudinal direction of the tube stack.

SUMMARY OF THE INVENTION

The present invention deals with the problem of providing an improved or at least another embodiment for such a heat exchanger, which contains at least one thermoelectric generator, which is characterized in particular by increased energetic efficiency. At the same time, the aim is a simpler and thus more cost-effective construction.

The invention is based on the general idea of equipping the heat exchanger with a housing, which in an interior receives the tube stack and which comprises a jacket, which encloses the tube stack in a circumferential direction. The circumferential direction in this case relates to the longitudinal direction of the tubes or of the tube stack. The invention furthermore is based on the general idea of configuring the housing or the jacket as a pre-tensioning spring, which presses the tube stack in the stacking direction in order to thereby improve the heat-transferring contact between the individual components of the tube stack. It has been shown that loading the components stacked on top of one another in the tube stack, i.e. the heating tubes, the cooling tubes and the thermoelectric generators leads to an improved heat transfer, which improves the energetic efficiency of the heat exchanger. By integrating the pre-tensioning function in the housing or in the jacket, additional separate components such as spring elements and bearing mats, for generating this pre-tensioning force, can be omitted, as a result of which the heat exchanger can be realized comparatively cost-effectively at the same time.

In order to implement this general basic idea of the present invention sketched above in the heat exchanger, it can be provided according to an advantageous solution to integrally equip the jacket at least with one pre-tensioning section, which is resiliently adjustable between a relaxed state and a tensioned state. The relaxed state exists with absent tube stack. The tensioned state exists in particular at least when the heat exchanger is finally assembled. The tensioned state can materialize even beforehand, for example when the tube stack is inserted into the housing and the housing or the jacket is finally assembled. To this end, it may be required for example to close the housing or the jacket at least in an axial section at least in the circumferential direction. Integrating the respective pre-tensioning section in the jacket means that for generating the required pre-tensioning force no additional separate component that has to be mounted to the jacket is required since the pre-tensioning section generating the desired pre-tensioning force forms an integral part of the jacket, i.e. is formed by a corresponding region or section of the jacket. The respective pre-tensioning section is thus an integral part of the housing, i.e. no separate component in this respect.

Since the pre-tensioning force generated with the help of the respective pre-tensioning section acts parallel to the stacking direction, which in turn runs perpendicularly to the longitudinal direction of the plate stack, an uneven force distribution is obtained in the circumferential direction. The pre-tensioning force acts according to the principle "action=reaction" in the stacking direction and in the opposite direction. Transversely thereto, the respective pre-tensioning section by contrast can generate no pre-tensioning forces or only such as are greatly reduced. The respective pre-tensioning section extends in cross section perpendicularly to the longitudinal centre axis of the plate stack in the circumferential direction over an angular range of less than 180°, for example over approximately 90° or less.

Preferably, the plate stack is constructed of multiple heating tubes and multiple cooling tubes, wherein additionally, thermoelectric generators can be provided.

Preferably, the individual tubes each have a substantially rectangular cross section, so that ultimately the plate stack preferably also has a substantially rectangular cross section. The stacking direction and the pre-tensioning force then run through two sides located diametrically opposite one another. In the cross section of the plate stack, these two sides then run substantially transversely to the stacking direction, while the two other sides then run substantially parallel to the stacking direction.

According to an advantageous embodiment, the jacket in the region of the respective pre-tensioning section can be designed so that the housing with absent tube stack, i.e. in the relaxed state, has an inner cross-sectional area transversely to the longitudinal direction of the housing, which coincides with the longitudinal direction of the tube stack, which is smaller than an inner cross-sectional area that the housing has when the tube stack is inserted therein and the tensioned state exists. In other words, the tube stack upon the assembly of the heat exchanger leads to an expansion of the housing in the region of the respective pre-tensioning section, wherein this expansion of the housing takes place reversibly and elastically. Because of this, the respective pre-tensioning section can particularly easily act as a spring, with the help of which the desired pre-tensioning forces can be realized.

The housing can be formed for example with the help of a jacket running around circumferentially in the circumferential direction, the circumferential ends of which are connected to one another in a suitable fixed manner, for example by way of a weld seam or a flange connection. With such an embodiment, the tube stack then has to be actively introduced into the jacket so that during the introducing of the tube stack into the jacket the aforementioned expansion of the inner cross section materializes. Alternatively to this, the housing can also be formed of two half shells, which are fastened to one another in the region of a separating plane on the ends facing one another, for example by means of welded connections or flange connections. With such an embodiment, the tube stack is initially placed into the one housing half. Following this, the other housing half is fitted, wherein for closing the housing in the circumferential direction, i.e. for fixing the two housing halves to one another, the housing has to be elastically deformed in the respective pre-tensioning section in order to be able to close the housing.

In an advantageous embodiment, the jacket can comprise at least two such integrated pre-tensioning sections, which with respect to the stacking direction are located opposite one another. Through this measure, the individual pre-tensioning section can be dimensioned smaller, which simplifies realizing the pre-tensioning sections in the jacket.

In another advantageous embodiment, at least one such pre-tensioning section can be convexly curved in the stacking direction towards the interior of the housing in the relaxed state. In the relaxed state, this convex curvature has a bending radius which is significantly enlarged when the tube stack is introduced or the jacket is transferred into the tensioned state, in particular, the pre-tensioning section can become flat in the tensioned state. Such a design makes possible comparatively high pre-tensioning forces with cost-effective realizability.

In another embodiment, at least one such pre-tensioning section can have a flat contact region running perpendicularly to the stacking direction and two spring regions, which are arranged on both sides of the contact region, and which connect the contact region on the respective side to wall sections of the jacket running along the stacking direction, preferentially parallel thereto. With the help of the flat contact region, the surface pressure on the outer sides of the tube stack concerned can be homogenized. Provided the housing consists of two half shells, the separating plane practically runs through the two wall sections extending along the stacking direction. Alternatively, it is likewise possible to arrange the separating plane differently, e.g. routing it through the contact region.

In another advantageous embodiment, the jacket can comprise two in particular linear wall sections extending along the stacking direction, preferentially parallel thereto, which are located opposite one another transversely to the stacking direction and transversely to the longitudinal direction of the tube stack. These wall sections absorb the pre-tensioning forces. Here, the wall sections are only subjected to tensile load, as a result of which they can be realized with a comparatively small wall thickness.

According to another advantageous embodiment, the housing can be divided in a division plane extending perpendicularly to the stacking direction and comprise an upper part and a lower part, wherein at least one of these parts comprises at least one such pre-tensioning section. As already explained, by dividing the housing, the assembly can be simplified.

According to another advantageous embodiment, the respective pre-tensioning section can extend in the longitudinal direction of the housing substantially over the entire length of the tube stack. In this way, as homogeneous as possible a pre-tension can be realized over the entire length of the tube stack. Alternatively, an embodiment is also conceivable in principle in which the housing comprises multiple singular pre-tension sections in the longitudinal direction, which are arranged in the longitudinal direction next to one another. For example, such individual pre-tensioning sections can be matched to the construction of the thermoelectric generators, which as a rule are assembled from multiple thermoelectric elements arranged in the longitudinal direction behind one another or next to one another. In particular, an embodiment can thus be realized in which within the respective thermoelectric generator a separate pre-tensioning section is provided for each thermoelectric element.

According to another advantageous further development, the jacket in the region of the respective pre-tensioning section can have a greater wall thickness than in the region of the respective wall section running along the stacking direction. Such a configuration can be realized for example with the help of so-called tailored blanks, i.e. with the help of plates which are assembled of multiple plates of different plate thickness. In this way, the housing parts can be optimized with respect to their loads.

Additionally or alternatively, the jacket in the region of the respective pre-tensioning section, according to another advantageous further development, can be produced from another material than in the region of the respective wall section running along the stacking direction. Such a configuration can also be realized for example with the help of tailored blanks, i.e. with the help of plates which in this case are assembled from multiple plates of different materials. In this way, the housing parts can be optimized with respect to their loads.

A combination of the above configurations is also conceivable in such a manner that the jacket in the region of the respective pre-tensioning section has a greater wall thickness and is produced from a material other than in the region of the respective wall section running along the stacking direction. Such a configuration can also be realized for example with the help of tailored blanks, i.e. with the help of plates which are assembled of multiple plates of different plate thickness and different materials.

In another advantageous embodiment, the respective heating tube or the respective cooling tube in its interior can comprise at least one support structure in the region of the respective pre-tensioning section, which stiffens the respective tube in the stacking direction. With the help of the pre-tensioning sections, comparatively large pre-tensioning forces can be introduced into the tube stack. In order to now avoid yielding of the heating tubes or cooling tubes through buckling, the respective tube can be stiffened with the help of such a support structure, which transmits the pre-tensioning force between the walls of the respective tube located opposite one another in the stacking direction.

Additionally or alternatively it can be provided that in the stacking direction between the jacket and the uppermost tube and/or between the jacket and the lowermost tube a stiffening plate is arranged. In the tensioned state, the respective pre-tensioning section then acts together with such a stiffening plate, which homogenously transmits the pre-tensioning force introduced therein to the tube or the tube stack adjoining thereon.

An internal combustion engine according to the invention, which is employed in particular in a motor vehicle, comprises an engine block, which comprises multiple combustion chambers, an exhaust system for discharging combustion exhaust gas from the combustion chambers, a cooling circuit for cooling the engine block and at least one heat exchanger of the type described above. Here, the at least on heating tube of the heat exchanger is fluidically coupled to the exhaust system, while the at least one cooling tube of the heat exchanger is fluidically coupled to the cooling circuit.

It is to be understood that the features mentioned above and still to be explained in the following cannot only be used in the respective combination stated but also in other combinations or by themselves without leaving the scope of the present invention.

Preferred exemplary embodiments of the invention are shown in the drawings and are explained in more detail in the following description, wherein same reference characters relate to same or similar or functionally same components.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
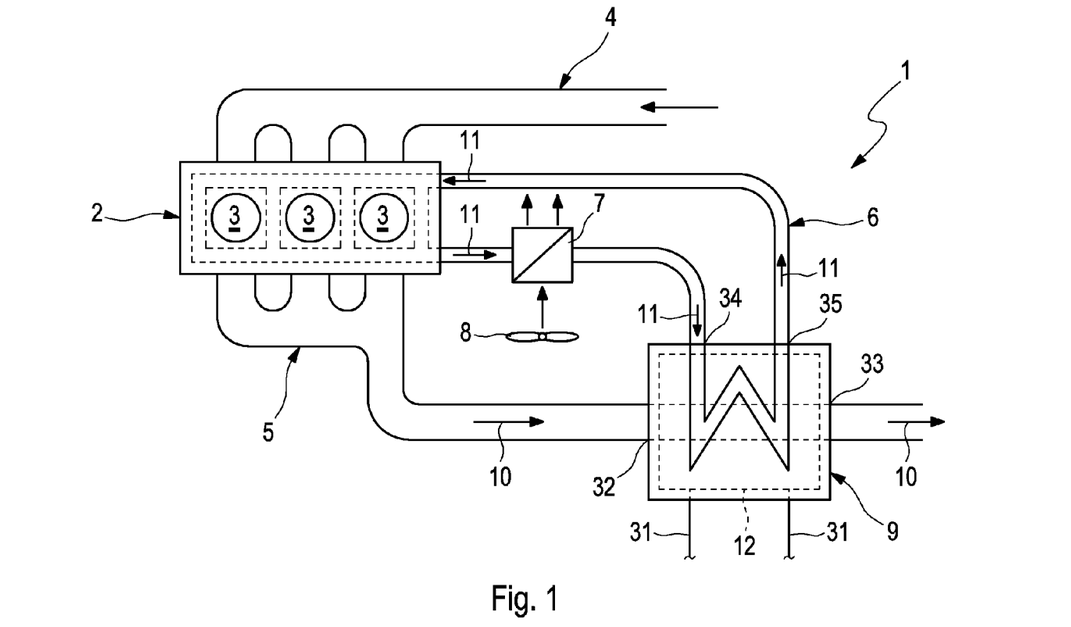
FIG. 1 is a highly simplified schematic representation of an internal combustion engine in the form of a circuit diagram.

Referring to the drawings in particular, according to FIG. 1, an internal combustion engine 1, which can be arranged in particular in a motor vehicle, comprises an engine block 2, which contains multiple combustion chambers 3, in which exhaust gas is created during combustion reactions. A fresh air system 4 supplies the combustion chambers 3 with fresh air. An exhaust system 5 discharges the exhaust gas 10 from the combustion chambers 3. The internal combustion engine 1 is equipped furthermore with a cooling circuit 6, in which a cooling medium 11 circulates and with the help of which the engine block 2 can be cooled. In the usual manner, an engine radiator 7 is incorporated in the cooling circuit 6, which can for example be actively subjected to a through-flow of ambient air with the help of a blower 8. The internal combustion engine 1 introduced here is additionally equipped with a heat exchanger 9, which on the one hand is fluidically incorporated in the exhaust system 5 and on the other hand fluidically incorporated in the cooling circuit 6 in such a manner that a heat transfer between the exhaust gas of the exhaust system 5 serving as heating medium 10 and the cooling medium 11 of the cooling circuit 6 can be realized.

According to FIG. 1, the heat exchanger 9 has a heating medium inlet 32, a heating medium outlet 33, a cooling medium inlet 34 and a cooling medium outlet 35. The flow direction of the heating medium 10 leads from the heating medium inlet 32 to the heating medium outlet 33. The flow direction of the cooling medium 11 leads from the cooling medium inlet 34 to the cooling medium outlet 35.

Figure 2:
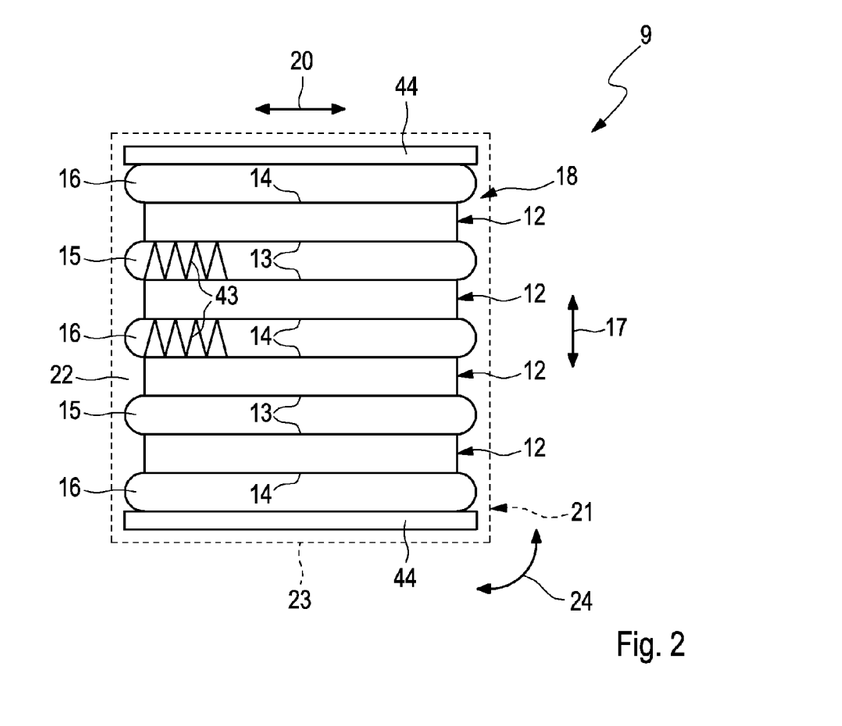
FIG. 2 is a highly simplified schematic cross sectional view of a heat exchanger.
Figure 3:
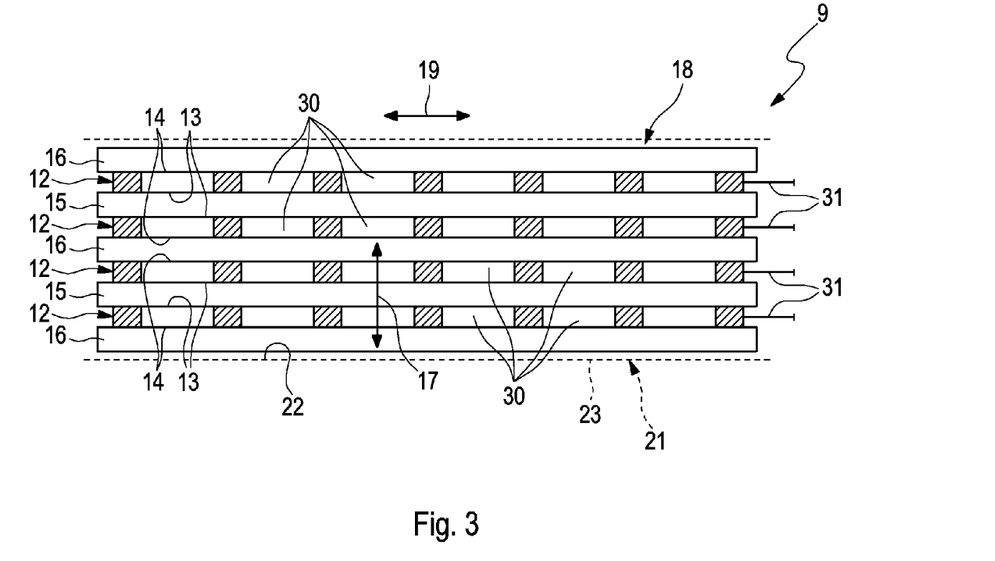
FIG. 3 is a simplified lateral schematic view of the heat exchanger.

Such a heat exchanger 9 according to FIGS. 2 and 3 comprises at least one thermoelectric generator 12. In the embodiment shown in FIGS. 2 and 3, the heat exchanger 9 purely exemplarily has four such thermoelectric generators 12. The respective thermoelectric generator 12 in this case has a hot side 13 and a cold side 14 each. Furthermore, the heat exchanger 9 comprises at least one heating tube 15. In the shown example, two such heating tubes 15 are provided. The respective heating tube 15 serves for conducting the heating medium 10 and is arranged in each case on at least one hot side 13 of such a thermoelectric generator 12. In the shown example, each heating tube 15 is arranged on two hot sides 13 facing one another on two adjacent thermoelectric generators 12. Finally, the heat exchanger 9 still comprises at least one cooling tube 16. In the shown example, three such cooling tubes 16 are provided, namely two outer cooling tubes 16 and a middle cooling tube 16. The respective cooling tube 16 serves for conducting the cooling medium 11 and in this case is arranged on at least one cold side 14 of at least one such thermoelectric generator 12. In the example, the two outer cooling tubes 16 each of a cold side 14 of a thermoelectric generator 12 are arranged. By contrast with this, the middle cooling tube 16 is arranged on two cold sides 14 of two adjacent thermoelectric generators 12 located opposite one another.

According to FIG. 3, the respective thermoelectric generator 12 is assembled in the usual manner from multiple separate thermoelectric elements 30, which are arranged in longitudinal direction 19 one behind the other and which are electrically interconnected in a suitable manner. Corresponding electrical connections 31 are led out of the heat exchanger 9, by way of which the electric current generated from the heat of the exhaust gas 10 can be drawn off.

The thermoelectric generators 12, the heating tubes 15 and the cooling tubes 16 are stacked on top of one another in a stacking direction 17, thus forming a tube stack 18. Within the tube stack 18, the thermoelectric generators 12, the heating tubes 15 and the cooling tubes 16 extend parallel to one another and thereby define a longitudinal direction 19 of the tube stack 18. In FIG. 2, a transverse direction 20 of the tube stack 18 is additionally indicated, which extends transversely to the stacking direction 17 and transversely to the longitudinal direction 19.

The heat exchanger 9 additionally comprises a housing 21, which in FIGS. 2 and 3 is indicated with a dashed line and which encloses an interior 22, in which the tube stack 18 is accommodated. The housing 21 has a jacket 23, which encloses the tube stack 18 in a circumferential direction 24 indicated in FIG. 2 by a double arrow. Here, the circumferential direction 24 relates to the longitudinal direction 19 of the tube stack 18 or of the tubes 15, 16. The configuration of the housing 21 or of the jacket 23 is explained in more detail with the help of the FIGS. 4 to 7. The housing 21 can be open or closed off with bottoms at its longitudinal ends.

Figure 4:
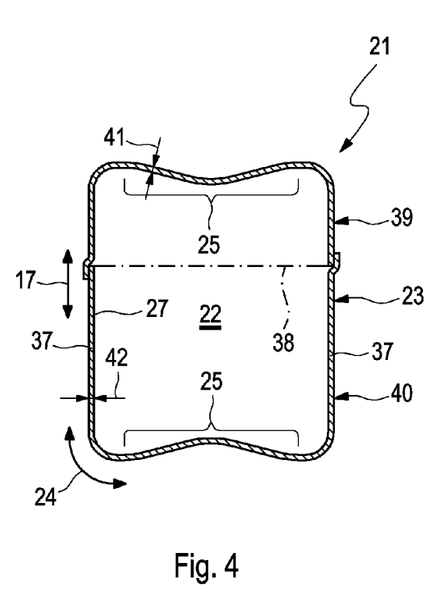
FIG. 4 is a schematic cross sectional view through a jacket of a housing of the heat exchanger in a relaxed state.
Figure 5:
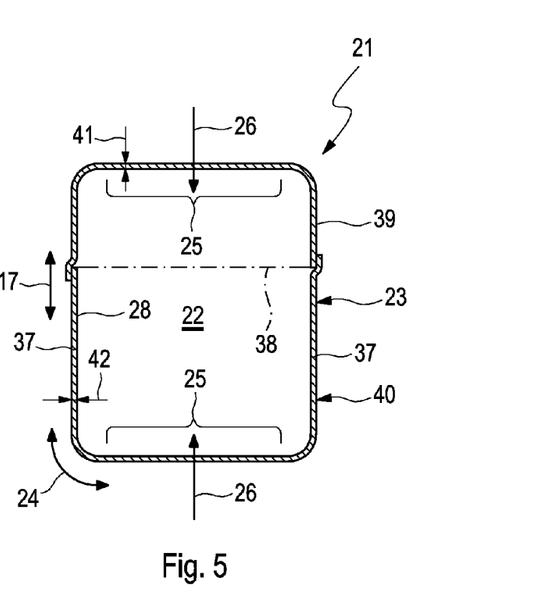
FIG. 5 is a cross sectional view of the jacket from FIG. 4, however in a tensioned state.
Figure 6:
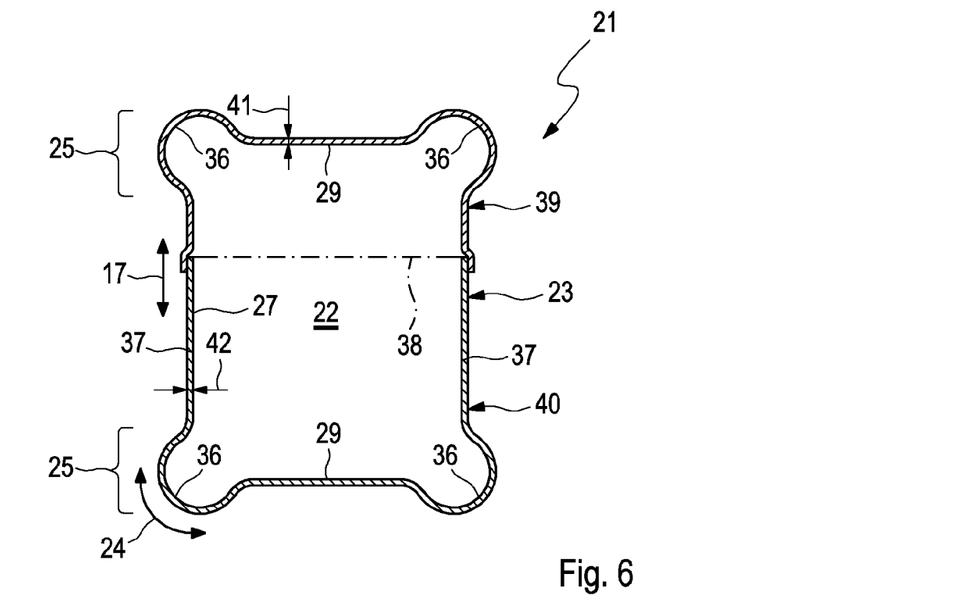
FIG. 6 is a cross sectional view of the jacket in the relaxed state as in FIG. 4, however with another embodiment.
Figure 7:
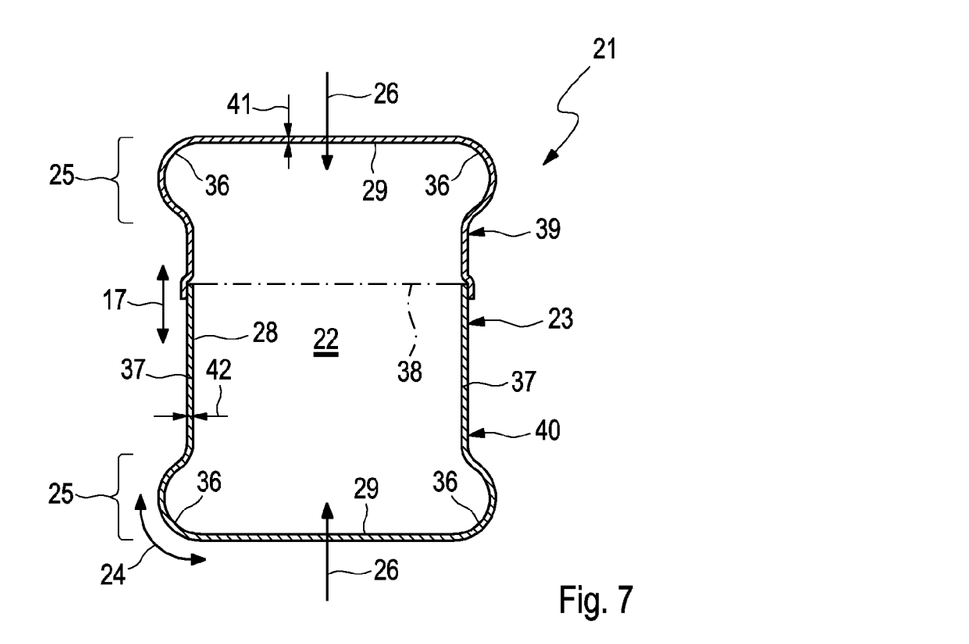
FIG. 7 is a cross section of the jacket from FIG. 6, however in the tensioned state.

According to FIGS. 4 to 7, the jacket 23 comprises at least one pre-tensioning section 25, which in the FIGS. 4 to 7 is indicated in each case by a curly bracket. In the shown cross sections, two such pre-tensioning sections 25 each are provided here, which are located opposite one another with respect to the stacking direction 17. The pre-tensioning sections 25 are integrally formed in the jacket 23, each thus forming an integral part of the jacket 23. The pre-tensioning sections 25 are each adjustable between a relaxed state shown in FIGS. 4 and 6 and a tensioned state shown in FIGS. 5 and 7. The relaxed state according to FIGS. 4 and 6 exists when the tube stack 18 is not accommodated in the housing 21. By contrast, the tensioned state according to FIGS. 5 and 7 exists when the tube stack 18 is arranged in the housing 21 and when at least the jacket 23 of the housing 21 is closed off in the circumferential direction. In this tensioned state, the pre-tensioning sections 25 according to FIGS. 5 and 7 each generate a pre-tensioning force 26 indicated by an arrow. These pre-tensioning forces 26 in this case run parallel to the stacking direction 17, and are orientated into the interior 22. Thus, the pre-tensioning forces 26 can press the tube stack 18 accommodated in the interior 22 in the stacking direction 17. In FIGS. 5 and 7, the tube stack 18 is not shown to maintain clarity. In the relaxed state, the housing 21 or the jacket 23 each has an inner cross-sectional area 27 in the cross sections shown in FIGS. 4 and 6 and running transversely to the longitudinal direction 19, which in the following is called relaxed inner cross-sectional area 27. By contrast, the respective housing 21 or the respective jacket 23 has an inner cross-sectional area 28 in the tensioned state in said cross section according to FIGS. 5 and 7, which in the following is called tensioned inner cross-sectional area 28. By comparing FIGS. 4 and 5 and by comparing FIGS. 6 and 7 respectively it is evident that the relaxed inner cross-sectional area 27 of the housing 21 or of the jacket 23 is smaller than the tensioned inner cross-sectional area 28. This means that the tube stack 18 introduced into the housing 21 leads to an expansion of the housing 21 or of the jacket 23, at least in the region of the respective pre-tensioning section 25. This cross-sectional expansion in this case is reversible and elastic, so that the pre-tensioning sections 25 act as springs.

In the embodiment shown in FIGS. 4 and 5, the pre-tensioning sections 25 are configured so that in the relaxed state according to FIG. 4 they are convexly curved in the stacking direction 17 towards the interior 22 of the housing 21. The dimensions of the housing 21 or of the jacket 23 are specifically selected here so that in the tensioned state according to FIG. 5 a flat orientation of the pre-tensioning sections 25 materializes, as a result of which a predefined pre-tension 26 can be introduced into the tube stack 18.

In the embodiment shown in FIGS. 6 and 7, the pre-tensioning sections 25 are configured so that the pre-tensioning section 25 has a contact region 29 and two spring regions 36. The respective contact region 29 in this case is configured flat while extending preferentially perpendicularly to the stacking direction 17. The spring regions 26 are arranged on both sides of the contact region 29 and are formed so that they connect the respective contact region 29 on the respective side to wall sections 37 of the jacket 23 which run parallel to the stacking direction 17. Furthermore, these spring regions 36 are designed as springs which pre-tension the respective contact region 29 towards the interior 22 for generating the pre-tension forces 26 parallel to the stacking direction 17.

In the embodiments of FIGS. 4 to 7, the housing 21 is divided in each case in a division plane 38, which runs perpendicularly to the stacking direction 17 in such a manner that the respective housing 21 has an upper part 39 and a lower part 40. The division plane 38 runs through the previously mentioned wall sections 37, which are located opposite one another transversely to the stacking direction 17 and here run transversely to the longitudinal direction 19 of the tube stack 18 and parallel to the stacking direction 17. Thus, with the configurations shown here, the upper part 39 has at least one such pre-tensioning section 25. Likewise, the respective lower part 40 has at least one such pre-tensioning section 25 each.

In principle it is also conceivable to turn the division plane 38 by 90° in such a manner that the respective division plane 38 runs through the pre-tensioning sections 25 located opposite one another in the stacking direction 17.

In the embodiments shown here, the respective pre-tensioning section 25 extends in the longitudinal direction 19 of the housing 21 substantially over the entire length of the tube stack 18. Accordingly, the housings 21 shown here have two pre-tensioning sections 25 each, namely in each case one in the upper part 39 and one in the lower part 40. Alternatively to this, multiple singular pre-tensioning sections 25 can also follow one another in the longitudinal direction 19. For example, five pre-tensioning sections 25 can follow one another in the longitudinal direction 19 according to the division of FIG. 3, which are each arranged in the region of the thermoelectric elements 30 located on top of one another in the region of the stacking direction 17, of which the individual thermoelectric generators 12 are composed.

According to an advantageous embodiment, the jacket 23 can have a wall thickness 41 in the region of the respective pre-tensioning section 25 that is greater than a wall thickness 42 that the jacket 23 has in one of the wall sections 37. Additionally or alternatively, it can be provided that the jacket 23 in the region of the pre-tensioning section 25 is produced from a material other than in the region of the wall sections 37. Such configurations can, for example, be realized by means of tailored blanks, which can be used as blanks for producing the housings 39, 40 through forming.

According to FIG. 2, support structures 43 can be arranged in the heating tubes 15 and in the cooling tubes 16, which stiffen the respective tube 15, 16 in the stacking direction 17. In FIG. 2, a section of such a support structure 43 is purely exemplarily indicated in only one of the heating tubes 15 and in only one of the cooling tubes 16.

Additionally or alternatively to such a support structure 43, it can be provided according to FIG. 2 that in the stacking direction 17 between the jacket 23 and the uppermost tube, here a cooling tube 16 and/or between the jacket 23 and the lowermost tube, here a cooling tube 16, a stiffening plate 44 is arranged. In the tensioned state, the respective pre-tensioning section 25 then interacts with such a stiffening plate 44 each, which homogeneously transmits the pre-tensioning force 26 introduced therein to the respective tube adjoining thereon, here the receptive cooling tube 16, or to the tube stack 18.

While specific embodiments of the invention have been shown and described in detail to illustrate the application of the principles of the invention, it will be understood that the invention may be embodied otherwise without departing from such principles.

The invention claimed is:

1. A heat exchanger for an exhaust system of an internal combustion engine in a motor vehicle, the heat exchanger comprising:

at least one thermoelectric generator, which has a hot side and a cold side;

at least one heating tub, for conducting a heating medium, arranged on the warm side of the at least one thermoelectric generator;

at least one cooling tube for conducting a cooling medium, which is arranged on the cold side of at least one such thermoelectric generator, wherein the at least one thermoelectric generator, the at least one heating tube and the at least one cooling tube are stacked on top of one another in a stacking direction and form a tube stack; and a housing with a housing interior which accommodates the tube stack and the jacket encloses the tube stack in a circumferential direction, wherein:

the jacket integrally comprises at least one pre-tensioning section, which is resiliently adjustable between a relaxed state, which is at least present with an absent tube stack and a tensioned state, which is at least present with the finally assembled heat exchanger; and the respective pre-tensioning section in the tensioned state generates a pre-tensioning force pressing the tube stack in the stacking direction.

2. The heat exchanger according to claim 1, wherein the jacket, in the relaxed state, has an inner cross-sectional area transversely to a longitudinal direction of the housing that is smaller than an inner cross-sectional area which the jacket has in the tensioned state.

3. The heat exchanger according to claim 1, wherein the jacket comprises at least two integrated pre-tensioning sections, which are located opposite one another with respect to the stacking direction.

4. The heat exchanger according to claim 3, wherein at least one pre-tensioning section is convexly curved in the relaxed state in the stacking direction towards the interior of the housing.

5. The heat exchanger according to claim 1, wherein the at least one pre-tensioning section comprises a flat contact region running perpendicularly to the stacking direction and two spring regions (36), which are arranged on both sides of the contact region and which connects the contact region on the respective side to wall sections of the jacket running parallel to the stacking direction.

6. The heat exchanger according to claim 1, wherein the jacket comprises two wall sections extending along the stacking direction, which are located opposite one another transversely to the stacking direction.

7. The heat exchanger according to claim 1, wherein the housing is divided in a division plane extending perpendicularly to the stacking direction and comprises an upper part and a lower part, wherein at least one of these parts comprises the at least one pre-tensioning section.

8. The heat exchanger according to claim 1, wherein the respective pre-tensioning section in a longitudinal direction of the housing substantially extends over the entire length of the tube stack.

9. The heat exchanger according to claim 6, wherein the jacket, in the region of the respective pre-tensioning section, has a wall thickness which is greater than a wall thickness which the jacket has in the region of the respective wall section.

10. The heat exchanger according to claim 6, wherein the jacket, in the region of the respective pre-tensioning section, is produced from a material other than in the region of the respective wall section.

11. The heat exchanger according to claim 1, wherein the respective heating tube and/or the respective cooling tube in an interior thereof comprises a support structure, which stiffens the respective tube in the stacking direction.

12. The heat exchanger according to claim 1, wherein in the stacking direction, between the jacket and the tube stack, at least one stiffening plate is arranged.

13. An internal combustion engine of a motor vehicle, the internal combustion engine comprising:

an engine block, which comprises multiple combustion chambers;

an exhaust system for discharging combustion exhaust gas from the combustion chambers;

a cooling circuit for cooling the engine block; and a heat exchanger comprising:

at least one thermoelectric generator, which has a hot side and a cold side;

at least one heating tube, for conducting a heating medium, arranged on the warm side of the at least one thermoelectric generator;

at least one cooling tube for conducting a cooling medium, which is arranged on the cold side of at least one such thermoelectric generator, wherein the at least one thermoelectric generator, the at least one heating tube and the at least one cooling tube are stacked on top of one another in a stacking direction and form a tube stack; and a housing with a housing interior which accommodates the tube stack and the jacket encloses the tube stack in a circumferential direction, wherein:

the jacket integrally comprises at least one pre-tensioning section, which is resiliently adjustable between a relaxed state, which is at least present with an absent tube stack and a tensioned state, which is at least present with the finally assembled heat exchanger;

the respective pre-tensioning section in the tensioned state generates a pre-tensioning force pressing the tube stack in the stacking direction; and the at least one heating tube is fluidically coupled to the exhaust system and the at least one cooling tube is fluidically coupled to the cooling circuit.

14. The heat exchanger according to claim 13, wherein the jacket, in the relaxed state, has an inner cross-sectional area transversely to a longitudinal direction of the housing that is smaller than an inner cross-sectional area which the jacket has in the tensioned state.

15. The heat exchanger according to claim 13, wherein the jacket comprises at least two integrated pre-tensioning sections, which are located opposite one another with respect to the stacking direction.

16. The heat exchanger according to claim 15, wherein at least one pre-tensioning section is convexly curved in the relaxed state in the stacking direction towards the interior of the housing.

17. The heat exchanger according to claim 13, wherein the at least one pre-tensioning section comprises a flat contact region running perpendicularly to the stacking direction and two spring regions, which are arranged on both sides of the contact region and which connects the contact region on the respective side to wall sections of the jacket running parallel to the stacking direction.

18. The heat exchanger according to claim 13, wherein the jacket comprises two wall sections extending along the stacking direction, which are located opposite one another transversely to the stacking direction.

19. The heat exchanger according to claim 13, wherein the housing is divided in a division plane extending perpendicularly to the stacking direction and comprises an upper part and a lower part, wherein at least one of these parts comprises the at least one pre-tensioning section.

20. The heat exchanger according to claim 13, wherein the respective pre-tensioning section in a longitudinal direction of the housing substantially extends over the entire length of the tube stack.

* * * * *